United States Patent
Kulinsky

(10) Patent No.: US 7,525,178 B2
(45) Date of Patent: Apr. 28, 2009

(54) SEMICONDUCTOR DEVICE WITH CAPACITIVELY COUPLED FIELD PLATE

(75) Inventor: Lawrence Kulinsky, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 213 days.

(21) Appl. No.: 11/586,130

(22) Filed: Oct. 25, 2006

(65) Prior Publication Data

US 2007/0090492 A1    Apr. 26, 2007

Related U.S. Application Data

(60) Provisional application No. 60/729,986, filed on Oct. 25, 2005.

(51) Int. Cl.
*H01L 23/58* (2006.01)
(52) U.S. Cl. .................. 257/630; 257/127; 257/170; 257/171; 257/409; 257/452; 257/484; 257/490; 257/494; 257/495; 257/605; 257/E29.012; 257/E29.013; 257/E29.016
(58) Field of Classification Search .............. 257/127, 257/170, 171, 452, 484, 490, 494, 495, 605, 257/630, E29.012, E29.013, E29.016
See application file for complete search history.

(56) References Cited

U.S. PATENT DOCUMENTS

| | | | | |
|---|---|---|---|---|
| 5,859,465 A * | 1/1999 | Spring et al. | ................ | 257/484 |
| 6,221,688 B1 * | 4/2001 | Fujihira et al. | ................ | 438/92 |
| 6,222,248 B1 * | 4/2001 | Fragapane | .................. | 257/565 |
| 6,563,197 B1 * | 5/2003 | Wagers et al. | ............... | 257/630 |
| 6,927,141 B2 * | 8/2005 | Andoh et al. | ............... | 438/380 |

* cited by examiner

*Primary Examiner*—Andy Huynh
(74) *Attorney, Agent, or Firm*—Ostrolenk, Faber, Gerb & Soffen, LLP

(57) ABSTRACT

A termination region of a semiconductor die is provided, which includes one or more field rings arranged in the termination region, one or more metal field plates, and an insulation layer disposed to prevent direct electrical contact between the field rings and the field plate such that the at least one field ring is capacitively coupled with the at least one field plate. Such a termination region may also include a polysilicon plate capacitively coupled with a diffusion region laterally spaced from the field rings, the polysilicon plate being located at an outer surface or directly under a passivation layer at an outer surface of the die. The termination region may also include floating field rings. The insulation layer may be a field oxide layer.

5 Claims, 2 Drawing Sheets

SEMICONDUCTOR DEVICE WITH CAPACITIVELY COUPLED FIELD PLATE

RELATED APPLICATION

The present application claims priority from U.S. Provisional Application No. 60/729,986, filed on Oct. 25, 2005, entitled Semiconductor Device with Capacitively Coupled Field Plate, listing Lawrence Kulinsky as the inventor, which provisional application is incorporated in full herein by reference.

FIELD OF THE INVENTION

The present invention relates to semiconductor devices and semiconductor processing, and more specifically relates to a termination region at a peripheral area of a die in which diffusion field rings, field plates and equipotential rings (EQR) are employed to manage the electric field.

BACKGROUND OF THE INVENTION

In a semiconductor device such as a MOSFET, or the like, the die is commonly terminated at a peripheral area by a series of spaced diffusions that form spaced PN junctions referred to as guard rings or field rings. Conventionally, these diffusions are electrically contacted to one or more field plates. Such termination regions are particularly important in power devices because of the large currents and large electric fields involved. A field plate is typically comprised of a metal, such as aluminum, or other conductor materials, and extends the electric potential forces at the depletion layer to beyond the edge of the field plate, thus reducing the depletion layer curvature and the intensity of the electric field. Diffusions may also be coupled with an equipotential ring (EQR) made of aluminum or other metals or conductive materials.

It is important to keep humidity, moisture or other contaminants from entering into the active regions of the die at the field plate or at the EQR. In some applications, the die may be used in environments that are prone to be humid, and in any event, seepage of moisture into the die may deleteriously affect the integrity of the die or its functioning within acceptable or recommended parameters.

FIG. 1 shows a termination region 31 of the die lying at a peripheral area of the active region 30 of the die. The die for example, may be a vertical conduction MOSFET, a lateral conduction MOSFET, another type of power die or some other type of semiconductor device. An electrode 20, such as a source electrode, at an upper surface of the active region 30 is also shown.

In the termination region 31 shown in FIG. 1, a number of floating field rings (FLRs) 10, sometimes referred to as guard rings, and field ring 10a are shown. Floating field rings 10 and field ring 10a are diffusions of a conductivity opposite to the conductivity of the surrounding body or layer in which they are formed. Thus, for example, floating field rings 10 and field ring 10a may be P-type diffusions formed in an N-type surrounding body.

Field ring 10a is electrically connected to a metallic field plate 22 located at or near an outer surface of the die. The field plate 22 may be made of aluminum, other conductive metal or metals, or other conductive materials. Also shown is a polysilicon element 23 in electrical contact with the metal field plate 23. A metal equally potential ring (EQR) 24 is shown electrically connected to diffusion ring 11 in the termination region 31. Also, polysilicon element 25 is electrically connected to the metal EQR 24. A passivation layer 28 is deposited on the upper surface of the die, including on the source electrode 20, the metal field plate 22 and the EQR ring 24.

In such a conventional arrangement, moisture, condensation, humidity, or other contamination may ingress into the device because the metal field plate 22 and the EQR 24 must be in direct electrical contact with the field ring 10a and the diffusion region 11.

SUMMARY OF THE INVENTION

A termination region of a semiconductor die is provided, which includes one or more field rings arranged in the termination region, one or more metal field plates, and an insulation layer disposed to prevent direct electrical contact between the field rings and the field plate such that the at least one field ring is capacitively coupled with the at least one field plate.

Such a termination region may also include a polysilicon plate capacitively coupled with a diffusion region laterally spaced from the field rings, the polysilicon plate being located at an outer surface or directly under a passivation layer at an outer surface of the die. The termination region may also include floating field rings. The insulation layer may be a field oxide layer.

DETAILED DESCRIPTION OF THE INVENTION

Figure 1:
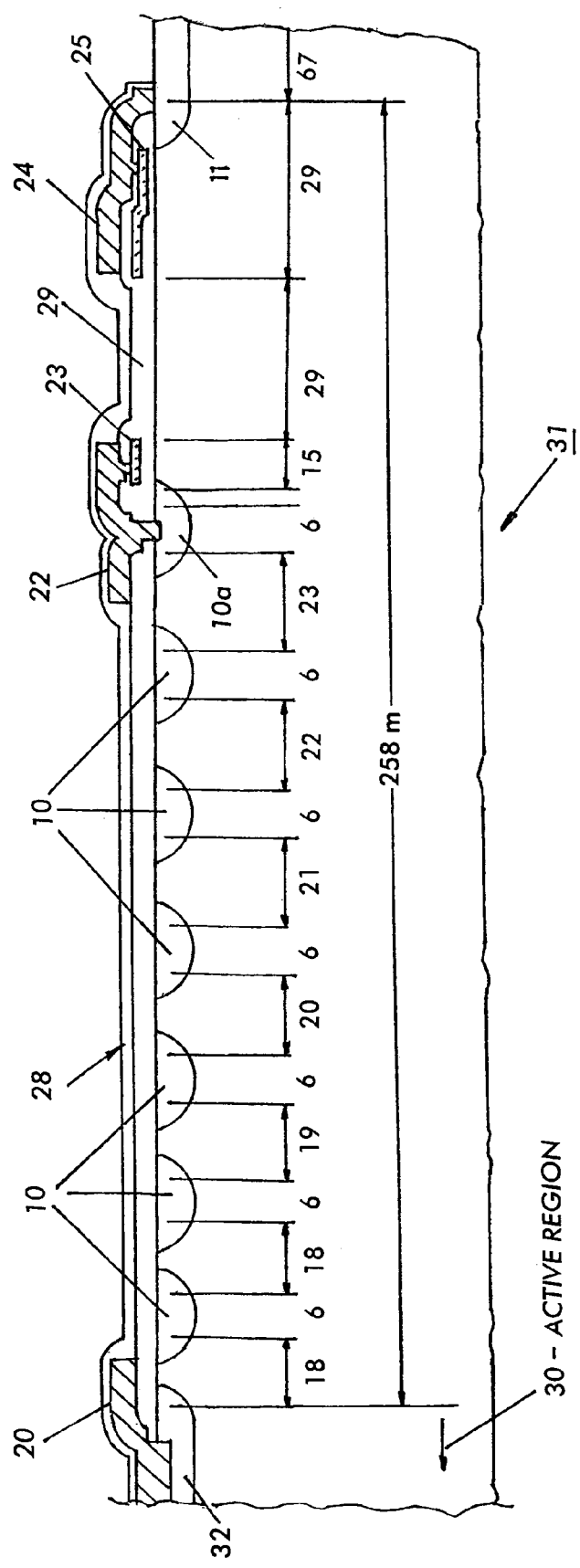
FIG. 1 is a schematic sectional side view of a portion of a termination region of a die showing electrical contacts between the floating field ring and the metal field plate and the EQR according to the prior art.
Figure 2:
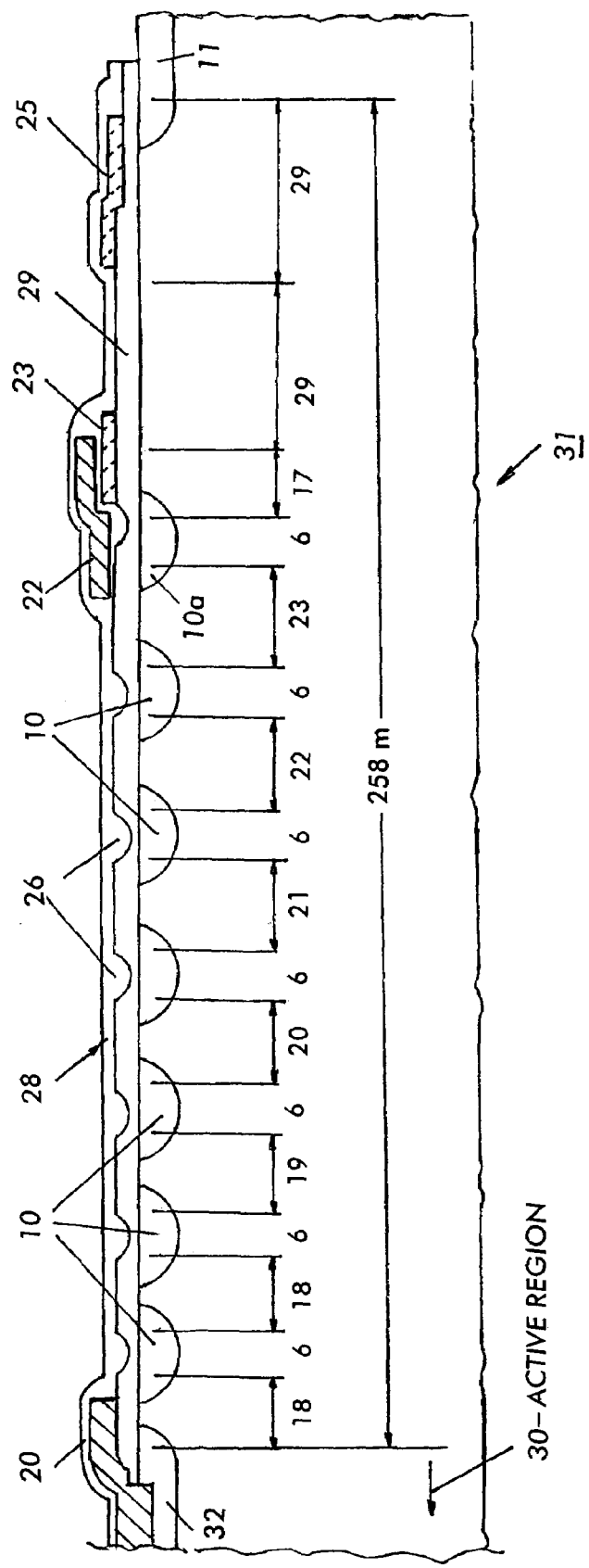
FIG. 2 is a schematic sectional side view of a portion of the termination region showing capacitive couplings between the floating field ring and the metal field plate and between the diffusion ring and the EQR.

FIG. 2 shows the field plate 22 capacitively coupled to ring 10a and conductive polysilicon plate capacitively coupled to diffusion ring 11. Descriptions in FIG. 2 of structures identical with structures of FIG. 1 will be omitted for the sake of brevity.

As shown in FIG. 2, floating field ring 10a is capacitively coupled with metal field plate 22 and with polysilicon element 23. An insulation layer, such as field oxide layer 29, is disposed between the floating field ring 10a and the metal field plate 22. According to an aspect of the invention, the field oxide layer 29 extends along substantially the entire top surface of the termination region 31 a. Accordingly, the capacitive coupling may help dissipate or manage the electric field in the termination region 31 of the die.

Passivation layer 26 is shown in FIG. 2 as being directly on top of the field oxide layer 29, which may further seal the die and may prevent direct electrical contact between structures of the die and other conductive structures adjacent to the die. Also, the polysilicon element 25 is capacitively coupled as part of a modified EQR with the diffusion ring 11.

Also shown are grooves 26 formed in the field oxide layer 29, provided opposite (above) each of the floating field rings 10.

By way of illustration, an example of spacial relationships between structures of the termination region of the die are provided. It will be understood that these examples of dimensions are provided for the purpose of illustration only, and the invention may be safely constructed using other dimensions not shown. For example, as shown in FIG. 2, a space between floating field rings 10 may gradually be increased from approximately 18 μm to approximately 23 μm, with a longer space between the final floating field ring 10a and the diffusion ring 11. As further shown in FIG. 2, the length of the conductive element 26 may be approximately 6 μm. Also, a distance between a deposition area 32 connected to the source electrode 20 on the active portion of the die and the diffusion ring 11 may be approximately 258 μm. Thus, for example, the polysilicon element 23 according to an aspect of the present invention may be approximately 17 μm in length. FIG. 1 shows a polysilicon element 23 approximately 15 μm in length.

It will be understood that a termination region 31 according to the invention may also be arranged such that a capacitive coupling may be disposed only between the floating field ring 10 and the metal field plate 22 or only between the diffusion ring 11 and the polysilicon element 25 of the EQR ring, or between both the floating field ring 10 and the diffusion ring 11 may be thus capacitively coupled to respective structures. In addition, while no metal element for the modified EQR ring is shown in FIG. 2 associated with the polysilicon element 25, the termination region 31 may also be structured so that an EQR 24 with a metal element is connected with the polysilicon element of 25.

Although the present invention has been described in relation to particular embodiments thereof, many other variations and modifications and other uses will become apparent to those skilled in the art. It is preferred, therefore, that the present invention be limited not by the specific disclosure herein.

The invention claimed is:

1. A termination region of a semiconductor die, comprising:
   at least one field ring disposed between an active region of the die and an edge of the die;
   a plurality of spaced floating field rings disposed between the one field ring and the active region;
   an insulation layer disposed over the one field ring and the plurality of spaced floating field rings;
   a polysilicon element disposed over the insulation layer; and
   a metal field plate disposed over the insulation layer above the one field ring and extending partially over the polysilicon element, wherein the polysilicon element and the metal field plate are isolated from the die by the insulation layer and wherein the polysilicon element and the metal field plate are capacitively coupled to the one field ring.

2. The termination region of claim 1, wherein the termination region further comprises:
   a polysilicon plate; and
   a diffusion region laterally spaced from the at least one field ring,
   wherein the insulation layer is disposed to prevent direct electrical contact between the polysilicon plate and the diffusion region, and to enable a capacitive coupling of the diffusion region and the polysilicon plate.

3. The termination region of claim 1, wherein the insulation layer comprises a field oxide layer.

4. The termination region of claim 1, wherein the termination region further comprises a passivation layer at an outer surface of the die above the field plate and the insulation layer.

5. The termination region of claim 1, wherein said insulation layer includes a plurality of grooves each disposed over a respective spaced field ring.

* * * * *